United States Patent

Kaneko et al.

Patent Number: 5,637,380
Date of Patent: Jun. 10, 1997

[54] COMPOSITION FOR A PROTECTIVE FILM, COLOR FILTER-PROVIDED SUBSTRATE USING IT AND LIQUID CRYSTAL DISPLAY DEVICE

[75] Inventors: Atsuko Kaneko; Shinya Tahara, both of Yokohama, Japan

[73] Assignee: AG Technology Co., Ltd., Yokohama, Japan

[21] Appl. No.: 439,795

[22] Filed: May 12, 1995

Related U.S. Application Data

[63] Continuation of Ser. No. 191,604, Feb. 4, 1994, abandoned.

[30] Foreign Application Priority Data

Feb. 9, 1993 [JP] Japan ................ 5-044567
Nov. 29, 1993 [JP] Japan ................ 5-298107

[51] Int. Cl.⁶ ................ B32B 3/00; B32B 5/16; B32B 7/14; G03F 9/00
[52] U.S. Cl. ................ 428/204; 428/205; 428/76; 522/142; 522/172; 522/182; 430/7; 430/280.1; 430/288.1; 430/272.1; 430/321; 430/961
[58] Field of Search ................ 430/7, 272, 280, 430/288, 321, 961; 522/142, 172, 182; 428/204, 205

[56] References Cited

U.S. PATENT DOCUMENTS

| | | | |
|---|---|---|---|
| 4,272,586 | 6/1981 | Ando et al. | 522/172 |
| 4,428,807 | 1/1984 | Lee et al. | 522/103 |
| 4,599,274 | 7/1986 | Ando et al. | 522/172 |
| 4,623,676 | 11/1986 | Kistner | 430/280 |
| 4,950,696 | 8/1990 | Palazzotto et al. | 522/25 |
| 4,985,340 | 1/1991 | Palazzotto et al. | 522/174 |
| 5,110,867 | 5/1992 | Schutyser et al. | 525/114 |
| 5,122,436 | 6/1992 | Tunney et al. | 522/142 |
| 5,147,900 | 9/1992 | Palazzotto | 522/25 |
| 5,236,793 | 8/1993 | Nishiwaki et al. | 430/7 |

FOREIGN PATENT DOCUMENTS

| | | | |
|---|---|---|---|
| 0484752 | 5/1992 | European Pat. Off. | 430/272 |
| 4-51202 | 2/1992 | Japan . | |
| 4-51203 | 2/1992 | Japan . | |
| 4-100003 | 4/1992 | Japan . | |
| 2119810 | 11/1983 | United Kingdom | 522/13 |

*Primary Examiner*—Glenn A. Caldarola
*Assistant Examiner*—J. Pasterczyk
*Attorney, Agent, or Firm*—Oblon, Spivak, McClelland, Maier & Neustadt, P.C.

[57] ABSTRACT

A composition for a protective film, which comprises the following components (A), (B), (C) and (D), wherein the proportions of the main components (A) and (B) are substantially from 5 to 60 wt % of (A) and from 35 to 90 wt % of (B), based on the total amount of the composition: (A) a photopolymerizable polyfunctional (meth)acrylate monomer and/or oligomer; (B) an oligomer or polymer of a non-acrylic epoxide; (C) a photopolymerization initiator; and (D) an epoxy-curing agent.

7 Claims, 1 Drawing Sheet

COMPOSITION FOR A PROTECTIVE FILM, COLOR FILTER-PROVIDED SUBSTRATE USING IT AND LIQUID CRYSTAL DISPLAY DEVICE

This application is a continuation of application Ser. No. 08/191,604, filed on Feb. 4, 1994, now abandoned.

BACKGROUND OF THE INVENTION

1. Field of the Invention

The present invention relates to a composition for a protective film, a color filter-provided substrate prepared by using it, and a liquid crystal display device employing the substrate.

2. Discussion of Background

By virtue of their characteristics such as thinness, lightness in weight and low consumption of electric power, light receptive display devices such as liquid display devices have found remarkable developments as display devices which can be substituted for CRTs (cathode ray tubes) which used to be main products of conventional display devices. It is a color filter that is essential to provide colors to such display devices and thereby to obtain a display performance closer to CRTs. Various materials and systems have been proposed for such a color filter.

A typical example is a dyed color filter obtainable by dyeing a thin film of a polymer such as gelatin with a dye, and such a dyed color filter has been used for a small size color television of liquid crystal system. This dyed color filter is excellent in transmittance and chromaticity. However, as the trend for large size liquid crystal display devices has progressed, some drawbacks have been pointed out, including e.g. inadequate uniformity of chromaticity over a large area, high costs resulting from the complexity of the process for its production and inadequate heat resistance or weather resistance resulting from the use of a dye.

To overcome such drawbacks, various methods for producing color filters have been proposed in recent years, including e.g. a so-called pigment dispersion method wherein a colorant is preliminarily dispersed in a photosensitive resin, and patterning is carried out by photolithography, a printing method wherein a pattern is directly formed on a substrate by screen, off-set or gravure printing using an inorganic or organic pigment, and an electrodeposition method.

However, such color filter-provided substrates have a problem that there will be nonuniformity in thickness (usually at least 0.1 μm) in each color or among different colors. In particular, by the above-mentioned pigment dispersion method, there will be substantial nonuniformity in thickness due to overlapping among different colors, while it is thereby possible to form a color filter with a high precision in patterning. Such nonuniformity in thickness causes a problem such that when such a color filter-provided substrate is used as an electrode substrate for a liquid crystal display device, no adequate contrast or gradation is obtained.

For such a color filter, it is common to form a transparent protective layer on the colored layer for the purpose of e.g. protecting the colored layer. Such a protective layer simultaneously has a function for leveling the colored layer to some extent. Accordingly, it is important to use as a protecting layer the one having a high leveling function. Other properties which the protective layer is required to have, include adhesion to a transparent electrode (such as ITO), patterning efficiency by etching, proper hardness, adhesion to glass and adhesion to sealing materials used for liquid display devices.

For such a protective layer, several materials have been proposed including, for example, acrylic type, polyimide-polyamide type and silicone type materials.

Acrylic materials are disclosed, for example, in Japanese Unexamined Patent Publications No. 17124/1986, No. 141401/1986 and No. 89022/1987. However, they usually have a drawback that their leveling function is inadequate. Further, they have another drawback that their adhesion to transparent electrodes and patterning efficiency are inadequate. Namely, when a transparent conductive film is formed on the protective layer and fine processing (patterning) is applied by photolitho process-wet etching treatment, no adequate adhesion between the protective film and the transparent conductive film tends to be obtained, whereby there has been a problem such that peeling occurs, or undercutting or side etching is substantial during the patterning of the transparent conductive film.

Polyimide-polyamide type materials are disclosed, for example, in Japanese Unexamined Patent Publications No. 78401/1985 and No. 77007/1986. These materials are usually superior to acrylic materials in the above-mentioned patterning efficiency and adhesion to a transparent electrode, but they have a drawback that their leveling function is extremely poor, and their costs are high. Therefore, these materials are not so commonly used.

Further, with respect to silicone type materials, thermosetting materials are disclosed, for example, in Japanese Unexamined Patent Publication No. 218771/1988. However, their leveling function is inadequate. Besides, they have problems such that no adequate adhesion between the protective film and the transparent conductive film tends to be obtained, and peeling occurs and undercutting or side etching is substantial during the patterning of the transparent conductive film.

As another attempt to level or flatten the surface of the protective layer, it has been proposed to polish the surface of the protective layer, for example, in Japanese Unexamined Patent Publications No. 193781/1989 and No. 206304/1989.

However, this method requires a step of polishing which is poor in the productivity and thus causes an increase of the costs. Further, this method has another problem that scratching marks are likely to result on the protective layer by polishing.

Recently, it has been proposed to use a protective layer made of a composition having a polyfunctional acrylate incorporated to an epoxy acrylate (Japanese Unexamined Patent Publications No. 51202/1992 and No. 100003/1992). However, such a protective layer has a problem that the hardness is so high that cracking is likely to result. Further, it has also been proposed to incorporate from 13 to 20 wt % of an epoxy resin to the above composition (Japanese Unexamined Patent Publication No. 51203/1992). However, with such a protective layer, there is a problem that no adequate adhesion can be secured between the protective layer and the substrate or the sealing portion when a liquid crystal cell is assembled.

SUMMARY OF THE INVENTION

It is an object of the present invention to overcome the above-mentioned drawbacks of the prior art and to provide a protective layer which has a proper hardness so that cracking scarcely occurs, which is excellent in leveling the colored layer and in adhesion to electrodes, which provides an enhanced adhesive strength between the protective film and the substrate or the sealing portion of a liquid crystal cell so as to prevent peeling of the protective film around its periphery or to prevent penetration of a reagent, etc. between the protective film and the substrate, and which is suitable to obtain a color filter-provided substrate of high and consistent quality with high productivity and at low costs.

The present inventors have conducted extensive studies to solve the above problems and as a result, have found it very effective for the solution of the above problems to employ as the protective layer the one obtained by curing a certain specific composition.

Thus, the present invention provides a composition for a protective film, which comprises the following components (A), (B), (C) and (D), wherein the proportions of the main components (A) and (B) are substantially from 5 to 60 wt % of (A) and from 35 to 90 wt % of (B), based on the total amount of the composition:

(A) a photopolymerizable polyfunctional (meth)acrylate monomer and/or oligomer;

(B) an oligomer or polymer of a non-acrylic epoxide;

(C) a photopolymerization initiator; and (D) an epoxy-curing agent.

The present also provides a composition for a protective film, which comprises the following components (A), (B), (C), (D) and (E), wherein the proportions of the main components (A) and (B) are substantially from 5 to 65 wt % of (A) and from 30 to 90 wt % of (B), based on total amount of the composition:

(A) a photopolymerizable polyfunctional (meth)acrylate monomer and/or oligomer;

(B) an oligomer or polymer of a non-acrylic epoxide;

(C) a photopolymerization initiator;

(D) an epoxy-curing agent; and (E) a silane coupling agent.

Further, the present invention provides a color filter-provided substrate, which comprises a substrate, a colored layer formed on the substrate and a protective layer formed on the colored layer, wherein the protective layer is a layer formed by curing the composition for a protective layer as defined above.

Furthermore, the present invention provides a liquid crystal display device comprising a pair of substrates constituting liquid crystal panels, wherein a color filter-provided substrate as defined above, is used for at least one of the substrates.

DETAILED DESCRIPTION OF THE PREFERRED EMBODIMENTS

Figure 1A:
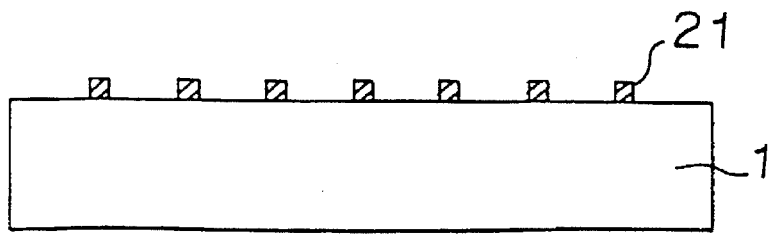
FIG. 1(a) to FIG. 1(d) are cross-sectional diagrammatical views illustrating a process for producing a color filter-provided electrode substrate of the present invention.

In the present invention, the photopolymerizable polyfunctional (meth)acrylate means a monomer or oligomer of a (meth)acrylate having a plurality of a carbon-carbon unsaturated bond such as an acryloyl group or a methacryloyl group which is a photosensitive group polymerizable or crosslinkable under irradiation with e.g. lights, at its terminals or on its side chains. Preferred is the one having a molecular weight of from 100 to 1,000.

The polyfunctional (meth)acrylate monomer may, for example, be 1,3-butanediol di(meth)acrylate, 1,4-butanediol di(meth)acrylate, 1,6-hexanediol di(meth)acrylate, diethylenediol di(meth)acrylate, neopentyl glycol di(meth)acrylate, hydroxypivalic acid ester neopentyl glycol di(meth)acrylate, tripropylene glycol di(meth)acrylate, trimethylolpropane tri (meth)acrylate, pentaerythritol tri(meth)acrylate or dipentaerythritol hexa(meth)acrylate. The oligomer may be the one comprising such a monomer as the sole component or as a copolymer component.

By using the monomer as the polyfunctional (meth) acrylate, it is possible to adjust the viscosity of the composition at a low level, whereby flattening or leveling at the time of coating the composition can be improved. On the other hand, by using the oligomer, it is possible to reduce the shrinkage during the curing, since the number of reactive sites is less. When the oligomer is used, it is preferred to use a reactive diluent in combination to adjust the viscosity of the composition.

As the epoxide, the following may, for example, be mentioned: a phenol novolak type epoxide, a cresol novolak type epoxide, a bisphenol A type epoxide, a bisphenol F type epoxide, a glycidylamine type epoxide, a brominate epoxide, an epoxy-modified silicone compound, an epoxymelamine compound, or an epoxy-modified urethane compound.

The epoxide of the present invention is non-acrylic. Here, the "non-acrylic" means that the epoxide has substantially no photopolymerizable (meth)acrylate group. If the oligomer or polymer of the epoxide has a (meth)acrylate group, the overall content of crosslinking components in the composition would be too much, and the hardness would increase so much that cracking tends to be likely to occur when a heat is exerted, for example, at a subsequent step of forming an ITO film or baking an orientation film. Further, it would be likely that at the time of cutting a cell into a desired size after assembling a pair of substrates together in the step of forming a cell, stress would be formed by the exerted external force, whereby the protective film would be peeled from the interface with the substrate at the sealing portion. For these reasons, the hardness of the protective film should be usually at most 6H, preferably at most 5H.

Further, the epoxy equivalent in the composition of the present invention is preferably from 100 to 1,000 g/eq. If the epoxy equivalent exceeds this range, the adhesion tends to be inadequate. On the other hand, if it is less than this range, the hardness tends to be inadequate. Particularly preferred is an epoxy equivalent of from 200 to 900 g/eq.

As the epoxide, an alicyclic epoxy may preferably be used. The alicyclic epoxy is an epoxy which is characterized in that it contains an alicyclic moiety in its structure. The carbon number of alicyclic moiety is preferably from 4 to 8. In view of the availability, an alicyclic epoxy containing a cyclohexane ring is usually preferred.

As compared with an aromatic epoxy resin, an alicyclic epoxy has characteristics such that it is excellent in the transparency, weather resistance and heat resistance, since it has no conjugated structure. Further, it does not contain ionic impurities such as $Na^+$ and $Cl^-$. Accordingly, non-uniformity of display can be minimized, when a liquid crystal display device is produced by using such a color filter-provided substrate.

The blend proportions of the photopolymerizable polyfunctional (meth)acrylate monomer and/or oligomer of component (A) and the oligomer or polymer of the non-acrylic epoxide of component (B) are usually from 5 to 65 wt % of (A) and from 35 to 95 wt % of (B), preferably from 40 to 50 wt % of (A) and from 50 to 60 wt % of (B).

A silane coupling agent (such as γ-glycidoxypropyltrimethoxysilane, γ-aminopropyltrimethoxysilane or γ-methacryloxypropyltrimethoxysilane) may be added to the system of the present invention. The amount of such a silane coupling agent is from 0.1 to 10 wt %, preferably from 1 to 5 wt %, based on the total amount of the composition exclusive of the diluting solvent. By the addition of such a silane coupling agent, the adhesion to glass can be improved, and the heat and moisture resistance characteristic can especially remarkably be improved.

The amounts of the polyfunctional (meth)acrylate of component (A) and the non-acrylic epoxide of component (B) are as follows.

When substantially no silane coupling agent is incorporated, the amounts are preferably from 5 to 60 wt % of (A) and from 35 to 90 wt % of (B), based on the total amount of the composition exclusive of the diluting solvent.

If the amount of the polyfunctional (meth)acrylate exceeds the above range, the amount of the oligomer or polymer of the non-acrylic epoxide will be relatively small, whereby the adhesion to glass tends to be low. Especially in the presence of a relatively large amount of water, a sharp decrease of the adhesion is likely to result.

On the other hand, if the amount of the oligomer or polymer of the non-acrylic epoxide exceeds the above range, the amount of the polyfunctional (meth)acrylate will be relatively small, and leveling tends to be poor. To ensure the desired effects, the amounts are more preferably from 10 to 60 wt % of (A) and from 35 to 85 wt % of (B), particularly preferably from 35 to 60 wt % of (A) and from 35 to 60 wt % of (B), most preferably from 35 to 50 wt % of (A) and from 45 to 60 wt % of (B).

When the silane coupling agent is incorporated to the composition, the adhesion will be improved. Therefore, it is possible to relatively increase the amount of the (meth)acrylate of component of (A) by reducing the amount of the epoxide of component (B). The amounts are preferably within ranges of from 5 to 65 wt % of (A) and from 30 to 90 wt % of (B), based on the total amount of the composition exclusive of the diluting solvent. To ensure the desired effects, the amounts are more preferably from 10 to 65 wt % of (A) and from 30 to 85 wt % of (B), particularly preferably from 35 to 65 wt % of (A) and from 30 to 60 wt % of (B), most preferably from 40 to 55 wt % of (A) and from 40 to 55 wt % of (B).

The photopolymerization initiator to be contained in the above composition may, for example, be 1-phenyl-2-hydroxy-2-methylpropan-1-one (tradename "Darocur 1173", manufactured by Merck Company), benzoinisobutyl ether (tradename "Bicure 10", manufactured by Stauffer Chemical Company), benzophenone (tradename "Kayacure BP", manufactured by Nippon Kayaku Co., Ltd.) or others including biacetyl, benzyl, benzoyl, benzyldimethylketal, tetramethylthiuram sulfide, azobisisobutylnitrile, benzoyl peroxide, di-tert-butyl-peroxide, 1-hydroxycyclohexylphenyl ketone, 1-(4-isopropylphenyl)-2-hydroxy-2-methylpropan-1-one, 1-(4-dodecylphenyl)-2-hydroxy-2-methyl-propan-1-one, 4-(2-hydroxyethoxy)-phenyl-(2-hydroxy-2-propyl)-ketone, diethoxyacetophenone, thioxanthan, methylthioxanthan and 2-chlorothioxanthan. The amount of the photopolymerization initiator is usually from 0.1 to 20 wt %, based on the total amount of the composition exclusive of the amount of the diluting solvent.

Further, a suitable sensitizer such as 4,4-bis (diethylamino)benzophenone may be added to the photopolymerization initiator benzophenone.

Further, as the epoxy curing agent, it is preferred to incorporate an acid anhydride type curing agent, an aromatic polyamine type curing agent, an aliphatic polyamine type curing agent, a cyclic aliphatic polyamine type curing agent, or a polyamide type curing agent. By the addition of the epoxy curing agent, it is possible to suppress such a tendency that the heat resistance becomes unstable due to a change of other components. The acid anhydride type curing agent may, for example, be phthalic anhydride, tetrahydrophthalic anhydride, methyltetrahydrophthalic anhydride, methylhexahydrophthalic anhydride, methylnadic anhydride, pyromellitic anhydride or trimellitic anhydride. In such a case, a Lewis base such as 2-ethyl-4-methylimidazole may be used as a curing accelerator.

The amount of the epoxy curing agent is preferably from 3 to 90 parts by weight per 100 parts by weight of the epoxide. Particularly preferred is not more than 70 parts by weight to avoid a possibility that an unreacted curing agent will increase the hygroscopicity of the coated film.

Further, an antioxidant, a photostabilizer, a defoaming agent, a leveling agent or the like may be added to this system.

For the purpose of increasing the hardness of the cured film, it is possible to incorporate silica sol or alumina sol to the above composition in an amount of from 0 to 40 wt %, preferably from 1 to 15 wt %, based on the total amount. It is preferred that the final hardness of the cured film will be at a level of a pencil hardness of at least HB, preferably at least 3H.

Furthermore, this composition may be diluted with a solvent such as methanol, isobutanol, hexylene glycol or diacetone alcohol to a solid concentration of about 20%.

The thickness of the protective layer is at a level of from 1 to 100 μm after curing. If the thickness is less than this range, leveling performance tends to be inadequate. On the other hand, if the thickness exceeds the above range, there will be a trouble such that the transparency deteriorates, or cracking will form, which causes deterioration of the strength. The thickness is preferably from 1.5 to 50 μm, more preferably from 2 to 10 μm, whereby adequate leveling performance can be obtained.

The substrate to be used in the present invention is not particularly limited. It may, for example, be an organic sheet such as a poly(ethylene terephthalate), polyester or diacetate sheet, or a transparent substrate such as various types of glass sheets. The thickness of the substrate is selected depending upon the particular purpose, and it not particularly limited. It is usually from 0.3 mm to 1.5 mm, when a glass substrate is used for a liquid crystal display device.

In the present invention, the color filter may be formed by the above-mentioned pigment dispersion method or any other method. The pattern of the color filter is likewise not particularly limited, and it may, for example, be a stripe pattern, a mosaic pattern or a delta pattern. Further, to improve the contrast, a light-shielding pattern such as a black matrix may be formed between patterns. Such a black matrix may be formed by a vapor deposition method of metallic chromium or by any other method such as patterning of a black photosensitive resist by photolithography.

Now, a process for producing a color filter-provided electrode substrate of the present invention, will be described with respect to a case where the pigment dispersion method is employed.

Firstly, a light-shielding layer called a black matrix is formed on a transparent substrate of e.g. a glass material or a plastic material. This light-shielding layer is provided to prevent deterioration of the contrast or to maintain the characteristics of the transistor in a liquid crystal device of TFT system. It may be formed of a metal chromium thin film excellent in the light-shielding properties.

Further, in a passive matrix drive represented by a liquid crystal device of STN (super twisted nematic) system, the black matrix may be omitted or may be formed by overlapping three primary colors or with a colored resist, since the contrast of such a device is inherently low as compared with the TFT system or for the purpose of reducing the costs.

Then, a colored resist comprising a colorant such as a pigment, and a photosensitive resin, is coated on the substrate, and exposure is conducted through a photomask having a predetermined pattern, followed by development to remove non-exposed portions to form a color pattern. At the time of exposure, a PVA (poly(vinyl alcohol)) layer may be overlaid as an oxygen-shielding film on the colored resist layer. This operation is repeated twice with other colors to form a color filter with three primary colors.

On this color filter, a layer of the above-mentioned composition will be formed. To form such a layer, various coaters such as a roll coater, an air knife coater, a blade coater, a rod coater, a bar coater and a spin coater may be employed.

Curing of the composition layer may be carried out by irradiating active energy rays such as ultraviolet rays by e.g. a high pressure mercury lamp or a xenon lamp, visible light rays or electron beams and heating. The exposed dose of the active energy rays may be at least 1,800 mJ/cm$^2$, for example, in the case of ultraviolet rays with a wavelength of 313 nm. The heating temperature may be from 100 to 250° C., preferably from 150 to 230° C. Irradiation may be made through a photomask for patterning, so that non-exposed portions will be removed by a solvent to form a pattern.

Then, an electrode layer is formed on the protective layer. The electrode layer is made of e.g. aluminum or chromium. In the case of a transmission type display device, it is required to be light transmitting, and it is usually preferred to employ indium tin oxide (ITO) or tin oxide. However, the material is not limited to such specific examples. Further, the electrode layer may be patterned in correspondence with the display. In the case where it is used as a common electrode, it may not be patterned. As a method for forming such an electrode layer, a vapor deposition method or a sputtering method is preferably employed from the viewpoint of making the layer thickness uniform, although the method is not particularly limited to such a method.

Further, in the present invention, an insulating film of e.g. $SiO_2$ or $TiO_2$, an active element such as TFT, MIM or thin film diode, a phase contrast film, a polarizing film, a reflective film or a photoconductive film may be formed on or beneath the substrate, as the case requires.

Further, in the case of a liquid crystal display device, an orientation film may be formed on the electrode-provided substrate, as the case requires. Such an orientation film may be the one prepared by rubbing an organic resin film of e.g. polyimide, polyamide or polyvinyl alcohol or the one formed by obliquely vapor depositing e.g. SiO, or an agent for vertical orientation may be coated.

For the production of a liquid crystal display device, a conventional method may be employed. Namely, using the above color filter-provided electrode substrate as one of the pair of substrates and an appropriately patterned electrode substrate as the other substrate, a liquid crystal orientation film is formed on each substrate, as the case requires, and then the pair of substrates are assembled so that the electrode sides face to each other, the periphery of the assembly is sealed to form a cell, and a liquid crystal is sealed in the cell, to form a color liquid crystal display device with high color definition.

The color filter-provided substrate of the present invention may, for example, be applied to a liquid crystal display panel, a display panel of a cathode ray tube or a receptor panel of an image pickup tube. It is particularly suitable for a liquid crystal device in which a high level of precision is required for the distance between the substrates, since it is possible to prepare a color filter with little non-uniformity in the thickness.

The reason why such high leveling performance can be obtained by the present invention, is not clearly understood, but may be explained as follows.

It is considered that immediately after being coated on the substrate, the film has fluidity and due to its leveling property, the coated film surface is flat irrespective of irregularities of the surface of the color filter located beneath. This leveling property is especially good when the film is coated by a spin coater. However, when the coated film is cured under heating, it is usual that as the solvent evaporates, curing gradually proceeds, and the film undergoes shrinkage and deforms to finally reflect the irregularities located below.

Whereas, according to the present invention, curing is facilitated and proceeds in a short period of time by irradiation of light before the solvent evaporates, whereby the flat coated film surface can be maintained, and it is possible to prevent deterioration of the flatness after the heat curing. The polyfunctional acrylate playing this role is an excellent material in that it has good photopolymerization efficiency, since it has a large quantity of acrylate groups, and the increase in the viscosity of the system during the solvent evaporation step can be minimized, since it has a low molecular weight.

Further, the protective layer of the present invention has an extremely high adhesion to glass and thus has high reliability. In this connection, the epoxide compound is believed to be playing an important role. It has been found by experiment that the adhesion to glass is sharply increased by an increase of the amount of the epoxide to some extent.

With the color filter-provided substrate of the present invention, it is unnecessary to polish the surface of the color filter as a subsequent step, whereby it is possible not only to improve the quality without formation of scratch marks or the like due to polishing, but also to obtain advantages such as shortening of the production time for the color filter, reduction of the costs and increase of the degree of cleanness.

Further, it is possible that the composition is coated over the entire surface, then a photomask with a negative pattern is overlaid thereon, followed by exposure for curing and then by development treatment with a developing solution to form a resin pattern of a desired shape. By this method, it is possible to selectively remove the protective layer along the sealing portion so that the sealing and bonding effect can be improved when a liquid crystal is sealed in the space between the color filter-provided electrode substrate and the opposingly laid electrode pattern-provided substrate, which are sealed along their periphery.

Now, the present invention will be described in further detail with reference to Examples. However, it should be understood that the present invention is by no means restricted by such specific Examples.

EXAMPLE 1

A process for producing a color filter of the present invention will be described with reference to FIG. 1(a) to (d).

Firstly, a chromium film is formed in a thickness of 100 nm on a transparent glass substrate 1 by a magnetron sputtering method. A photosensitive resist pattern was formed thereon by means of a photomask. Then, the chromium film was subjected to etching to form light-shielding patterns 21 (FIG. 1(a)).

Figure 1B:
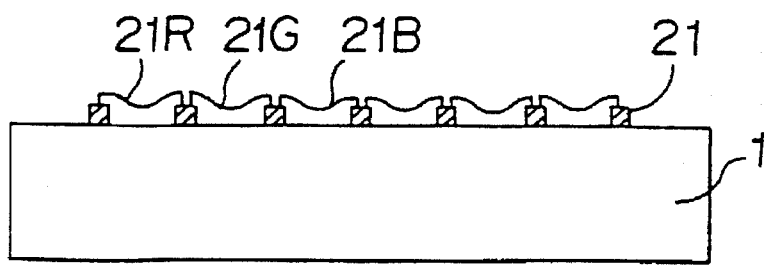

Then, in the same manner, colored patterns of red 21R, green 21G and blue 21B were sequentially formed between the light-shielding patterns (FIG. 1(b)).

As the composition, a composition as identified in Table 1 was dissolved in a solvent mixture comprising xylene, toluene, ethyl acetate and propylene glycol monoethyl ether to obtain a solution having a solid content concentration of 27 wt %.

Figure 1C:
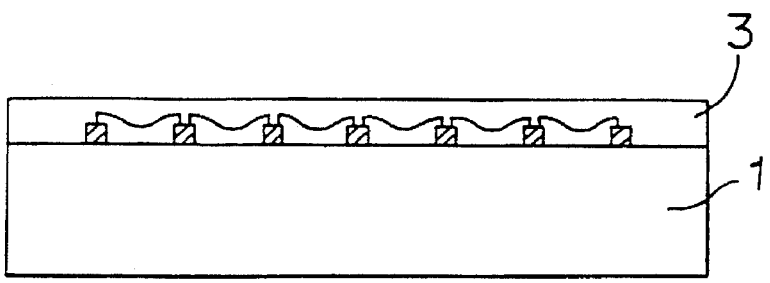

The solution of this composition was coated over the entire surface of the above colored patterns by a spin coater so that the thickness of the protective film 3 after curing would be 2.5 μm (FIG. 1(c)). Then, light of 3,500 mJ/cm² (wavelength λ=365 nm) was irradiated by means of a high pressure mercury lamp. Further, heating was conducted under the conditions of 200° C. for 30 minutes to completely cure the composition.

With respect to the color filter prepared by the method of the above Example, irregularities of the surface before and after the formation of the coating layer on the colored patterns were examined by means of a surface roughness meter. Further, with respect to the adhesion to glass, the substrate having the cured film formed thereon was subjected to a boiling test for 5 hours in boiling water, a pressure cooker test (PCT) for 20 hours at 121° C. under a humidity of 99% under 2 atm and a high temperature high humidity test for 500 hours at 80° C. under a humidity of 90%, and then the adhesion was evaluated by a cross cut test. The adhesion was represented by the proportion of the non-peeled test specimens shown by percentage. Further, the hardness of the film was evaluated by pencil hardness.

The results are shown in Table 1. Among the epoxides in the Table, CN is a cresol novolak type epoxide (molecular weight: 915, epoxy equivalent: 210 g/eq), PN is a phenol novolak type epoxide (epoxy equivalent: 175 g/eq), GA is a glycidylamine type epoxide (molecular weight: 422, epoxy equivalent: 119 g/eq), BA is a bisphenol A type epoxide (epoxy equivalent: 186 g/eq), BF is a bisphenol F type epoxide (epoxy equivalent: 167 g/eq), and SK is an alicyclic epoxide (epoxy equivalent: 180 g/eq).

Likewise, among the polyfunctional acrylates, P is pentaerythritol triacrylate, T is trimethylolpropane triacrylate, and "C1" and "C2" represent compounds of the following chemical formulas, respectively.

$$CH_2=C(CH_3)COOCH_2CH(OH)CH_2OOCH=CH_2 \quad [C1]$$

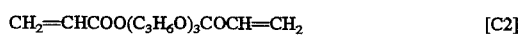

$$CH_2=CHCOO(C_3H_6O)_3COCH=CH_2 \quad [C2]$$

Further, among the epoxy curing agents, MH is methylhexahydrophthalic anhydride, MN is methylnadic anhydride, BA-A is bisphenol-modified amine, SK-A is modified aliphatic amine, and SB-A is aliphatic diamine.

As the photopolymerization initiator, 2-hydroxy-2-methyl-1-phenylpropan-1-one was used. As the silane coupling agent, γ-glycidoxypropyltrimethoxy silane was used. As the leveling agent, a silicone-type leveling agent was used. The amount of the leveling agent was represented by weight %, based on the total amount of other components.

TABLE 1

| | | | 1 | 2 | 3 | 4 | 5 | 6 | 7 | 8 | 9 |
|---|---|---|---|---|---|---|---|---|---|---|---|
| Composition (wt %) | Epoxide | | CN | CN | CN | CN | CN | CN | CN | GA | GA |
| | | | 9.1 | 27.3 | 36.4 | 54.5 | 81.8 | 54.5 | 54.5 | 54.5 | 81.8 |
| | Epoxy curing agent | | MN | MN | MN | MN | MN | MN | MN | MN | MN |
| | | | 0.9 | 2.7 | 3.6 | 5.5 | 8.2 | 5.5 | 5.5 | 5.5 | 8.2 |
| | Polyfunctional acrylate 1 | | P | P | P | P | P | C1 | C2 | P | P |
| | | | 71.5 | 55.5 | 47.6 | 31.7 | 7.94 | 31.7 | 31.7 | 31.7 | 7.94 |
| | Polyfunctional acrylate 2 | | T | T | T | T | T | T | T | T | T |
| | | | 14.3 | 11.1 | 9.5 | 6.4 | 1.58 | 6.4 | 6.4 | 6.4 | 1.58 |
| | Polymerization initiator | | 4.2 | 3.6 | 2.9 | 1.9 | 0.5 | 1.9 | 1.9 | 1.9 | 0.5 |
| | Silane coupling agent | | Nil | Nil | Nil | Nil | Nil | Nil | Nil | Nil | Nil |
| Leveling agent | | | 0.05 | 0.05 | 0.05 | 0.05 | 0.05 | 0.05 | 0.05 | 0.05 | 0.05 |
| Flatness (irregularities) (μm) | | | 0.02 | 0.03 | 0.03 | 0.08 | 0.20 | 0.08 | 0.08 | 0.08 | 0.20 |
| Adhesive strength | Boiling water: | 5 hr | 0 | 0 | 99 | 100 | 100 | 100 | 100 | 100 | 100 |
| | PCT: | 20 hr | 0 | 0 | 92 | 95 | 100 | 95 | 95 | 95 | 100 |
| | 80° C./90%: | 500 hr | 0 | 0 | 10 | 20 | 100 | 20 | 20 | 20 | 100 |
| Hardness | | | 7H | 6H | 5H | 4H | 3H | 4H | 4H | 4H | 3H |

TABLE 2

| | | 10 | 11 | 12 | 13 | 14 | 15 | 16 | 17 | 18 |
|---|---|---|---|---|---|---|---|---|---|---|
| Composition (wt %) | Epoxide | PN | PN | PN | PN | PN | PN | PN | PN | PN |
| | | 42.7 | 33.7 | 35.6 | 28.5 | 61.2 | 41.2 | 34.9 | 30.2 | 25.2 |
| | Epoxy curing agent | BA-A | BA-A | BA-A | BA-A | BA-A | MH | MH | MH | MH |
| | | 4.3 | 3.4 | 21.4 | 28.5 | 6.1 | 4.1 | 10.5 | 15.1 | 20.2 |
| | Polyfunctional acrylate 1 | P | P | P | P | P | P | | | |
| | | 37.2 | 44.1 | 30.2 | 30.2 | 22.9 | 36.0 | 36.0 | 36.0 | 36.0 |
| | Polyfunctional | T | T | T | T | T | T | T | T | T |

TABLE 2-continued

|  |  |  | 10 | 11 | 12 | 13 | 14 | 15 | 16 | 17 | 18 |
|---|---|---|---|---|---|---|---|---|---|---|---|
|  | acrylate 2 |  | 7.4 | 8.8 | 6.0 | 6.0 | 4.6 | 7.2 | 7.2 | 7.2 | 7.2 |
|  | Polymerization initiator |  | 8.3 | 9.8 | 6.7 | 6.7 | 5.1 | 8.0 | 8.0 | 8.0 | 8.0 |
|  | Silane coupling agent |  | Nil | Nil | Nil | Nil | Nil | 3.4 | 3.4 | 3.4 | 3.4 |
| Leveling agent |  |  | 0.09 | 0.01 | 0.07 | 0.07 | 0.05 | 0.08 | 0.08 | 0.08 | 0.08 |
| Flatness (irregularities) (μm) |  |  | 0.03 | 0.02 | 0.06 | 0.06 | 0.10 | 0.03 | 0.03 | 0.03 | 0.03 |
| Adhesive strength | Boiling water: | 5 hr | 100 | 0 | 50 | 50 | 100 | 100 | 100 | 100 | 43 |
|  | PCT: | 20 hr | 100 | 0 | 90 | 100 | 100 | 100 | 100 | 97 | 95 |
|  | 80° C./90%: | 500 hr | 92 | 0 | 40 | 11 | 100 | 100 | 82 | 99 | 25 |
| Hardness |  |  | 6H | 7H | 5H | 5H | 4H | 6H | 6H | 7H | 7H |

TABLE 3

|  |  |  | 19 | 20 | 21 | 22 | 23 | 24 | 25 | 26 | 27 |
|---|---|---|---|---|---|---|---|---|---|---|---|
| Composition (wt %) | Epoxide |  | PN | PN | PN | PN | PN | PN | PN | PN | PN |
|  |  |  | 22.7 | 45.4 | 43.4 | 39.9 | 37.0 | 33.3 | 55.1 | 52.2 | 47.3 |
|  | Epoxy curing agent |  | MH | Nil | MH | MH | MH | MH | Nil | MH | MH |
|  | acrylate 1 |  | 22.7 |  | 4.3 | 12.0 | 18.5 | 26.6 |  | 5.2 | 14.2 |
|  | Polyfunctional acrylate 1 |  | P | P | P | P | P | P | P | P | P |
|  |  |  | 36.0 | 36.0 | 34.4 | 31.7 | 29.3 | 26.4 | 29.1 | 27.6 | 25.0 |
|  | Polyfunctional acrylate 2 |  | T | T | T | T | T | T | T | T | T |
|  |  |  | 7.2 | 7.2 | 6.9 | 6.3 | 5.9 | 5.3 | 5.8 | 5.5 | 5.0 |
|  | Polymerization initiator |  | 8.0 | 8.0 | 7.6 | 7.0 | 6.5 | 5.9 | 6.5 | 6.1 | 5.6 |
|  | Silane coupling agent |  | 3.4 | 3.4 | 3.2 | 3.0 | 2.8 | 2.5 | 3.4 | 3.3 | 3.0 |
| Leveling agent |  |  | 0.08 | 0.08 | 0.08 | 0.07 | 0.07 | 0.06 | 0.07 | 0.06 | 0.06 |
| Flatness (irregularities) (μm) |  |  | 0.03 | 0.03 | 0.03 | 0.04 | 0.05 | 0.06 | 0.06 | 0.06 | 0.07 |
| Adhesive strength | Boiling water: | 5 hr | 55 | 96 | 100 | 100 | 100 | 100 | 100 | 100 | 100 |
|  | PCT: | 20 hr | 24 | 15 | 100 | 100 | 100 | 100 | 100 | 100 | 100 |
|  | 80° C./90%: | 500 hr | 18 | 50 | 100 | 100 | 100 | 100 | 100 | 100 | 100 |
| Hardness |  |  | 8H | 6H | 6H | 6H | 6H | 6H | 5H | 5H | 5H |

TABLE 4

|  |  |  | 28 | 29 | 30 | 31 | 32 | 33 | 34 | 35 | 36 |
|---|---|---|---|---|---|---|---|---|---|---|---|
| Composition (wt %) | Epoxide |  | PN | PN | CN | CN | CN | CN | CN | CN | CN |
|  |  |  | 43.2 | 38.2 | 41.2 | 30.2 | 50.4 | 37.0 | 41.2 | 30.2 | 50.4 |
|  | Epoxy curing agent |  | MH | MH | MH | MH | MH | MH | MH | MH | MH |
|  |  |  | 21.6 | 30.6 | 4.1 | 15.1 | 5.1 | 18.5 | 4.1 | 15.1 | 5.1 |
|  | Polyfunctional acrylate 1 |  | P | P | P | P | P | P | P | P | P |
|  |  |  | 22.8 | 20.2 | 36.0 | 36.0 | 29.3 | 29.3 | 36.0 | 36.0 | 29.3 |
|  | Polyfunctional acrylate 2 |  | T | T | T | T | T | T | T | T | T |
|  |  |  | 4.6 | 4.0 | 7.2 | 7.2 | 5.9 | 5.9 | 7.2 | 7.2 | 5.9 |
|  | Polymerization initiator |  | 5.1 | 4.5 | 8.0 | 8.0 | 6.5 | 6.5 | 8.0 | 8.0 | 6.5 |
|  | Silane coupling agent |  | 2.7 | 2.4 | 3.4 | 3.4 | 2.8 | 2.8 | 3.4 | 3.4 | 2.8 |
| Leveling agent |  |  | 0.05 | 0.05 | 0.08 | 0.08 | 0.07 | 0.07 | 0.08 | 0.08 | 0.07 |
| Flatness (irregularities) (μm) |  |  | 0.07 | 0.08 | 0.03 | 0.03 | 0.06 | 0.05 | 0.03 | 0.03 | 0.06 |
| Adhesive strength | Boiling water: | 5 hr | 100 | 100 | 100 | 100 | 100 | 100 | 100 | 74 | 100 |
|  | PCT: | 20 hr | 100 | 100 | 100 | 100 | 100 | 100 | 100 | 100 | 100 |
|  | 80° C./90%: | 500 hr | 100 | 100 | 96 | 77 | 91 | 99 | 99 | 79 | 100 |
| Hardness |  |  | 5H | 5H | 6H | 6H | 5H | 5H | 6H | 6H | 5H |

TABLE 5

|  |  |  | 37 | 38 | 39 | 40 | 41 | 42 | 43 | 44 |
|---|---|---|---|---|---|---|---|---|---|---|
| Composition (wt %) | Epoxide | | CN | BA | BA | BF | BF | PN | PN | PN |
| | | | 37.0 | 45.4 | 41.2 | 45.4 | 41.2 | 41.2 | 41.2 | 41.2 |
| | Epoxy curing agent | | MH | Nil | MH | Nil | MH | BA-A | SK-A | SB-A |
| | | | 18.5 | | 4.1 | | 4.1 | 4.1 | 4.1 | 4.1 |
| | Polyfunctional acrylate 1 | | P | P | P | P | P | P | P | P |
| | | | 29.3 | 36.0 | 36.0 | 29.3 | 29.3 | 36.0 | 36.0 | 36.0 |
| | Polyfunctional acrylate 2 | | T | T | T | T | T | T | T | T |
| | | | 5.9 | 7.2 | 7.2 | 5.9 | 5.9 | 7.2 | 7.2 | 7.2 |
| | Polymerization initiator | | 6.5 | 8.0 | 8.0 | 6.5 | 6.5 | 8.0 | 8.0 | 8.0 |
| | Silane coupling agent | | 2.8 | 3.4 | 3.4 | 2.8 | 2.8 | 3.4 | 3.4 | 3.4 |
| Leveling agent | | | 0.07 | 0.08 | 0.08 | 0.07 | 0.07 | 0.08 | 0.08 | 0.08 |
| Flatness (irregularities) (μm) | | | 0.05 | 0.04 | 0.04 | 0.04 | 0.04 | 0.03 | 0.03 | 0.03 |
| Adhesive strength | Boiling water: | 5 hr | 100 | 100 | 100 | 100 | 100 | 100 | 100 | 100 |
| | PCT: | 20 hr | 100 | 100 | 100 | 100 | 100 | 100 | 100 | 100 |
| | 80° C./90%: | 500 hr | 100 | 100 | 100 | 100 | 100 | 100 | 100 | 100 |
| Hardness | | | 5H | 6H | 6H | 6H | 6H | 6H | 6H | 6H |

TABLE 6

|  |  |  | 45 | 46 | 47 | 48 | 49 | 50 |
|---|---|---|---|---|---|---|---|---|
| Composition (wt %) | Epoxide | | SK | SK | SK | SK | SK | SK |
| | | | 65.9 | 59.9 | 55.5 | 50.4 | 45.4 | 41.2 |
| | Epoxy curing agent | | Nil | MH | Nil | MH | Nil | MH |
| | | | | 6.0 | | 5.1 | | 4.1 |
| | Polyfunctional acrylate 1 | | P | P | P | P | P | P |
| | | | 22.4 | 22.4 | 29.3 | 29.3 | 36.0 | 36.0 |
| | Polyfunctional acrylate 2 | | T | T | T | T | T | T |
| | | | 4.5 | 4.5 | 5.9 | 5.9 | 7.2 | 7.2 |
| | Polymerization initiator | | 5.0 | 5.0 | 6.5 | 6.5 | 8.0 | 8.0 |
| | Silane coupling agent | | 2.1 | 2.1 | 2.8 | 2.8 | 3.4 | 3.4 |
| Leveling agent | | | 0.05 | 0.05 | 0.07 | 0.07 | 0.08 | 0.08 |
| Flatness (irregularities) (μm) | | | 0.08 | 0.07 | 0.06 | 0.05 | 0.04 | 0.04 |
| Adhesive strength | Boiling water: | 5 hr | 100 | 100 | 100 | 100 | 100 | 100 |
| | PCT: | 20 hr | 100 | 100 | 100 | 100 | 99 | 100 |
| | 80° C./90%: | 500 hr | 100 | 100 | 100 | 100 | 99 | 99 |
| Hardness | | | 3H | 3H | 4H | 4H | 5H | 5H |

As is evident from Tables 1 to 6, the protective films for color filters of the present invention have adequate hardness, and their flatness and adhesion to glass are good. The irregularities of the surface of the colored layer before forming the protective layer was 0.15 μm. With respect to the adhesion, there is a no practical problem if the value exceeds 70 by the cross cut test after treatment in boiling water for 5 hours. However, in consideration of a case where a high level of reliability is required, PCT and the high temperature high humidity test at 80° C. under a humidity of 90% were conducted. It is shown that this property is improved remarkably by incorporation of the silane coupling agent.

Figure 1D:
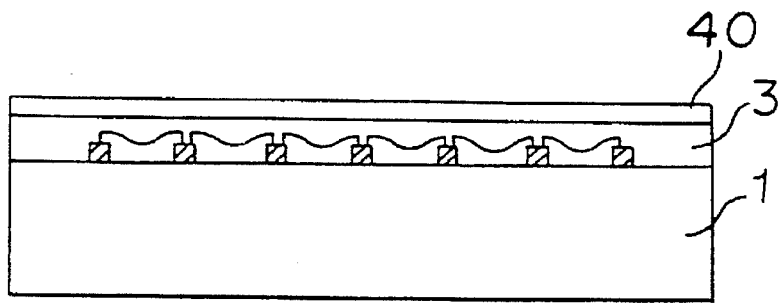

Then, an ITO film 40 was formed in a thickness of 0.25 μm by a magnetron sputtering method (FIG. 1(d)). On the ITO film, a resist (a masking agent) was coated in the form of lines. Then, patterning of the ITO film was carried out by immersion in a hydrochloric acid-ferric chloride type etching solution.

In each case of the present invention, there was no problem with respect to both the change in the electrical resistance of ITO and the patterning property, and the results were good.

EXAMPLE 2

Using the color filter-provided electrode substrate obtained in Test Example 4 or 5 as one of the pair of substrates and an electrode-provided substrate as the other substrate, an orientation film prepared by rubbing a polyimide film, was formed on the surface of each substrate. As the liquid crystal, liquid crystal ZLI 2293 (tradename, manufactured by Merck Company) having a chiral compound incorporated was used, and the liquid crystal was sandwiched between the substrates to obtain a 1/240 duty liquid crystal display device with a twist angle of 240°. This liquid crystal display device was operated, whereby there was little in-plane color difference, and the contrast and color reproduction were good, and thus it was confirmed that full color display of high quality can be obtained.

By curing the composition of the present invention, a protective film having an extremely high leveling ability and adequate adhesion to a glass substrate, can be obtained. This is a protective film most suitable for a color filter-provided substrate and has a wide range of applications as a hard coating material.

With the color filter-provided substrate of the present invention, it is unnecessary to polish the surface of the color filter as a subsequent process step, whereby it is possible not only to improve the quality without formation of scratch marks or the like due to polishing but also to obtain advantages such as shortening of the time for the production of a color filter, reduction of the costs and increase of the degree of cleanness.

Further, by using the color filter-provided electrode substrate of the present invention, it is possible to obtain a full color liquid crystal display device of a high quality which is excellent in the contrast and color reproduction with little in-plane color difference and which has high reliability.

What is claimed is:

1. A color filter-provided substrate, which comprises a substrate, a colored layer formed on the substrate and a protective layer formed on the colored layer, wherein the protective layer is a layer formed by irradiating and then heating a protective film composition consisting essentially of the following components (A), (B), (C), (D) and (E), wherein the proportions of the main components (A) and (B) are substantially from 10 to 65 wt. % of (A) and from 30 to 85 wt. % of (B), based on the total amount of the composition:

(A) a photopolymerizable polyfunctional (meth)acrylate monomer and/or oligomer;

(B) an oligomer or polymer of a non-acrylic epoxide;

(C) a photopolymerization initiator for (meth)acrylates;

(D) an aliphatic diamine epoxy-curing agent; and (E) a silane coupling agent.

2. The substrate of claim 1, wherein the proportions of the components (A) and (B) are from 35 to 65 wt. % of (A) and from 30 to 60 wt. % of (B).

3. The substrate of claim 1, wherein said oligomer or polymer of a non-acrylic epoxide is an alicyclic epoxide containing an alicyclic moiety having 4 to 8 ring carbon atoms.

4. The substrate of claim 1, wherein said heating is at a temperature from 100° C. to 250° C.

5. The substrate of claim 4, wherein said heating is at a temperature from 150° C. to 230° C.

6. The substrate of claim 1, wherein said protective film has a hardness of at most 6H.

7. The substrate of claim 6, wherein said protective film has a hardness of at most 5H.

* * * * *